(12) United States Patent
Lee (10) Patent No.: US 7,084,031 B2
(45) Date of Patent: Aug. 1, 2006

(54) METHOD FOR MANUFACTURING FLASH MEMORY DEVICE AND FLASH MEMORY DEVICE

(75) Inventor: Young Bok Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/879,671

(22) Filed: Oct. 18, 2004

(65) Prior Publication Data

US 2005/0233524 A1 Oct. 20, 2005

(30) Foreign Application Priority Data

Apr. 20, 2004 (KR) .................. 10-2004-0027108

(51) Int. Cl.
*H01L 21/336* (2006.01)

(52) U.S. Cl. .................. 438/257; 438/264; 438/265

(58) Field of Classification Search ......... 438/257–266
See application file for complete search history.

(56) References Cited

U.S. PATENT DOCUMENTS

| 6,620,681 B1* | 9/2003 | Kim et al. .................. 438/257 |
| 6,914,013 B1* | 7/2005 | Chung ........................ 438/770 |
| 2004/0082129 A1* | 4/2004 | Nagata ........................ 438/264 |

FOREIGN PATENT DOCUMENTS

JP    2002-208629    7/2002

* cited by examiner

*Primary Examiner*—H. Jey Tsai
(74) *Attorney, Agent, or Firm*—Marshall Gerstein & Borun LLP (57) ABSTRACT

The present invention relates to a method for manufacturing a flash memory device and a flash memory device manufactured by the same. In the present invention, an annealing process of a tunnel insulating film is performed at a relatively low temperature to optimize the threshold voltage of a NHVN transistor. Furthermore, in case of portions not compensated through the annealing process of the tunnel insulating film, the quality of the tunnel insulating film is compensated through a subsequent liner oxide film deposition process and a HDP oxide film annealing process. Therefore, the present invention can improve reliability of the tunnel insulating film and thus provide a flash memory device having good properties.

18 Claims, 8 Drawing Sheets

METHOD FOR MANUFACTURING FLASH MEMORY DEVICE AND FLASH MEMORY DEVICE

BACKGROUND

1. Field of the Invention

The present invention relates to a method for manufacturing a flash memory device and a flash memory device manufactured by the same, and more specifically, to a method for manufacturing a flash memory device and a flash memory device manufactured by the same, which can improve the quality of a tunnel oxide film.

2. Discussion of Related Art

Recently, there is an increasing demand for a flash memory device that can be electrically programmed and erased and has a refresh function of rewriting data in a given period. Research for higher-integration technology of a memory device has been actively made in order to develop a large-capacity memory device capable of storing lots of data therein. In this case, programming refers to an operation of writing data into the memory cell and erasure refers to an operation of erasing data written into the memory cell.

For higher-integration of a memory device, an NAND-type flash memory device in which a plurality of memory cells are serially connected (i.e., structure in which a drain or a source among neighboring cells are shard) to form a single string, The NAND-type flash memory device is a memory device from which information is sequentially read unlike a NOR-type flash memory device. The programming and erasure operations of the NAND-type flash memory device are performed by controlling the threshold voltage Vt of the memory cell by injecting or discharging electrons into or from a floating gate through F-N tunneling scheme.

In the NAND-type flash memory device, securing reliability of the memory cell is an integral problem. In particular, the data retention properties of the memory cell come to the front as an important problem. As described above, however, in the NAND-type flash memory device, the programming and erasure operations are performed through F-N tunneling scheme. In such repetitive F-N tunneling process, electrons are trapped in the tunnel oxide film of the memory cell, which causes the threshold voltage Vt of the memory cell to shift. Thus, there occurs a case where data originally stored in the memory cell may be erroneously recognized when reading the data. That is, there occurs a problem that reliability of the memory cell is degraded.

Shift in the threshold voltage of the memory cell is caused by electrons trapped in the tunnel oxide film by means of repetitive F-N tunneling process due to cycling. In the above, the cycling refers to a process of repeatedly performing the programming operation and the erasure operation. In order to prevent the shift in the threshold voltage of the memory cell, there was proposed a method for reducing an erasure voltage sufficiently below a verify voltage by controlling a bias condition (i.e., bias voltage) upon programming and erasure. In this method, however, the threshold voltage is increased as much as the bias voltage. This still poses a problem that the threshold voltage shifts. As another method for preventing shift in the threshold voltage of the memory cell, there is a method for reducing a thickness of the tunnel oxide film to reduce the amount of electrons trapped at the time of F-N tunneling. This method for reducing the thickness of the tunnel oxide film, however, has a limit due to a fundamental data retention quality problem or a read disturbance problem.

SUMMARY OF THE INVENTION

Accordingly, the present invention has been made in view of the above problems, and it is an object of the present invention to provide a method for manufacturing a flash memory device and a flash memory device manufactured by the same, in which the quality of a tunnel insulating film is improved to minimize a shift in the threshold voltage of a memory cell due to cycling and the data retention quality of the memory cell is thus improved to increase reliability of the memory cell.

In order to accomplish the above object, according to a preferred embodiment of the present invention, there is provided a method for manufacturing a flash memory device, comprising the steps of: forming a tunnel insulating film on a semiconductor substrate; forming a first polysilicon film on the insulating film; forming a pad nitride film on the first polysilicon film; forming a trench by selectively etching the pad nitride film, the first polysilicon film, the tunnel insulating film and the semiconductor substrate; forming a liner oxide film on the inner sidewall of the trench; forming a first oxide film and filling the trench with the first oxide; applying a first annealing process to the first oxide film; removing the pad nitride film; forming a second polysilicon film on the first polysilicon layer exposed by removing the pad nitride film, wherein the first polysilicon film and the second polysilicon film form a floating gate; forming a dielectric film on the entire structure having the second polysilicon layer; forming a control gate on the dielectric film; and forming source/drain regions in the semiconductor substrate exposed between the gates.

DETAILED DESCRIPTION OF PREFERRED EMBODIMENTS

Now the preferred embodiments according to the present invention will be described with reference to the accompanying drawings.

FIG. 1 and FIG. 2, and FIG. 3A to FIG. 3H are cross-sectional view of NAND-type flash memory devices shown to explain a method for manufacturing a flash memory device according to a preferred embodiment of the present invention. FIG. 3A to FIG. 3E show portions of a memory cell region CELL in the flash memory device shown in FIG. 1 and FIG. 2. In these drawings, for example a NAND-type flash memory device is shown.

Figure 1:
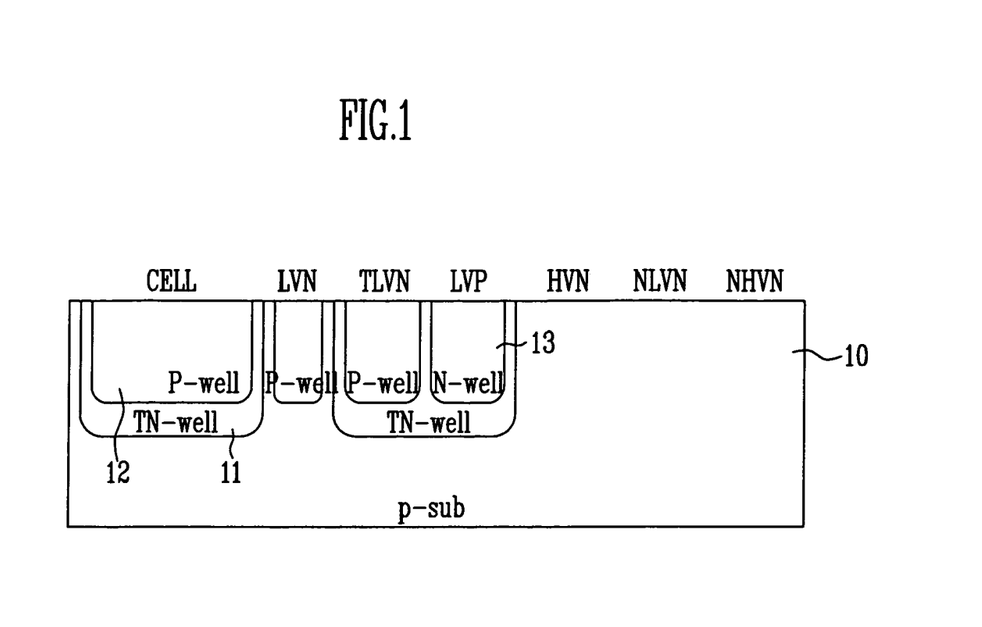
FIG. 1 and FIG. 2, and FIG. 3A to FIG. 3H are cross-sectional view of NAND-type flash memory devices shown to explain a method for manufacturing a flash memory device according to a preferred embodiment of the present invention.

Referring to FIG. 1, a P-type semiconductor substrate P-sub 10 is provided. The semiconductor substrate 10 can be divided into a cell region CELL, a low voltage NMOS (LVN) transistor region LVN, a triple LVN (TLVN) transistor region TLVN, a low voltage PMOS (LVP) transistor region LVP, a high voltage NMOS (HVN) transistor region HVN, a native LVN (NLVN) transistor region NLVN, and a native high voltage NMOS (NHVN) transistor region NHVN.

A screen oxide film (not shown) is formed on the semiconductor substrate 10. In this case, the screen oxide film is formed in order to prevent the interface of the semiconductor substrate 10 from being damaged due to an ion implantation process performed in a subsequent process.

Thereafter, a triple N-well (TN-well) 11 and a P-well 12: are formed within the semiconductor substrate 10. A N-well 13 is then formed in the LVP region LVP. At this time, the TN-well 11 can be formed in a dose of 1.0E13 to 3.0E13 using phosphorus (P) with ion implantation energy of 1.0 MeV to 2.0 MeV. Further, the P-well 12 can be formed through at least three-times ion implantation process. The ion implantation process for forming the P-well 12 is performed in a dose of 1.0E13 to 3.0E13 using boron (B) with ion implantation energy of 500 KeV to 600 KeV and then in a dose of 1.0E13 to 2.0E12 with ion implantation energy of 200 KeV to 300 KeV. Finally, the ion implantation process is performed in a dose of 2.0E12 to 7.0E12 with ion implantation energy of 50 KeV to 200 KeV. At this time, in each step, the tilt is 0° to 45° and the twist is 0° to 270°. At this time, the tilt refers to an implantation angle and the twist refers to an implantation turning angle.

Next, in order to form a channel, the LVN transistor region LVN is experienced by a double ion implantation process. The double ion implantation process is performed in a dose of 5.0E11 to 8.0E12 using boron with ion implantation energy of 30 KeV to 70 KeV and then in a dose of 5.0E12 to 8.0E14 with ion implantation energy of 10 KeV to 30 KeV. In each step, the tilt is 0° to 45° and the twist is 0° to 270°.

Figure 2:
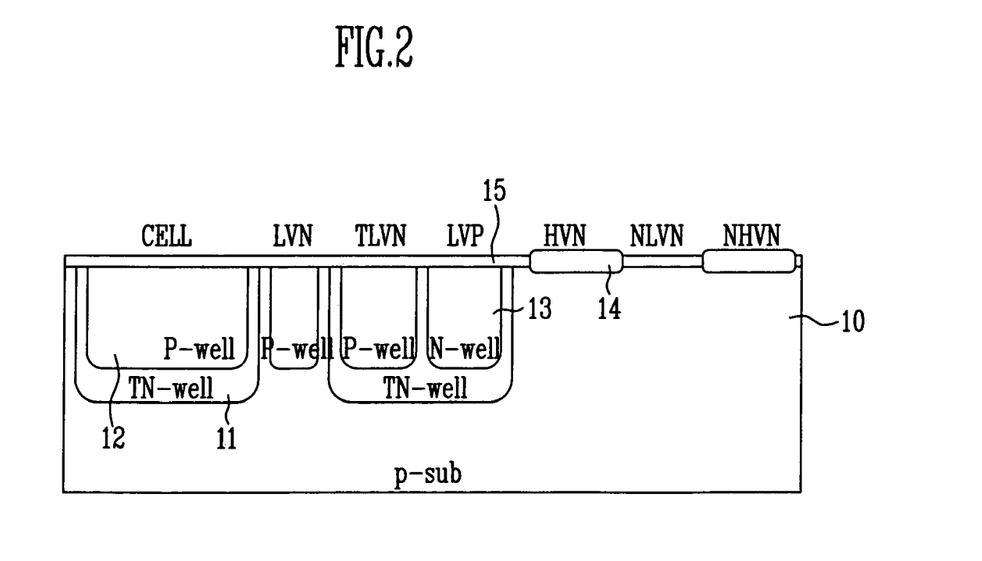

Referring to FIG. 2, a gate oxide film 14 for a high voltage (HV) transistor is thickly formed in the HVN region HVN. In this case, the gate oxide film 14 can be formed by forming a photoresist pattern (not shown) or a pad nitride film (not shown) on the entire structure so that the HVN region HVN is opened, and then performing a wet oxidization process and a annealing process using the photoresist pattern or the pad nitride film as a mask. For example, the gate oxide film 14 can be formed in thickness of 300 Å to 400 Å by performing a wet oxidization process under a temperature range of 750° C. to 800° C. and then performing an annealing process using $N_2$ under a temperature range of 900° C. to 910° C. for 20 to 30 minutes.

Next, the gate oxide film 14 of a proper thickness is stripped. At this time, the process of stripping the gate oxide film 14 can be performed in three steps; the first step using buffer oxide etchant (BOE, 300:1), the second step using a $H_2SO_4$ solution, and the third step using C-1($NH_4OH/H_2O_2/H_2O$). Further, it is preferred that in a target at the time of the stripping process, the remaining oxide film remains 15 Å to 45 Å in thickness. Before a tunnel insulating film 15 is formed, the entire structure is experienced by a pre-cleaning process. The pre-cleaning process is performed in order to strip all the oxide films remaining on the entire structure. In this case, the pre-cleaning process can be performed in two steps; the first step using DHF (diluted HF) and the second step using SC-1($NH_4OH/H_2O_2/H_2O$).

Thereafter, the tunnel insulating film 15 is formed on the entire structure. At this time, the tunnel insulating film 15 can be formed in thickness of 60 Å to 90 Å by performing a wet oxidization process under a temperature condition of 750° C. to 850° C. and then performing an annealing process using $N_2$ under a temperature condition of 900° C. to 910° C. for 20 to 30 minutes. Alternately, the tunnel insulating film 15 can be formed in such a way that pure oxide is formed in thickness of 60 Å to 90 Å and an annealing process using $N_2O$ gas of 10 slm is then performed under a temperature condition of 900° C. to 950° C. for 10 to 30 minutes to form an oxynitride film of 70 Å to 100 Å in thickness. Alternately, the tunnel insulating film 15 can be performed in such a way that pure oxide is formed in thickness of 60 Å to 90 Å, an annealing process using $N_2O$ gas of 10 slm is performed under a temperature condition of 900° C. to 950° C. for 10 to 30 minutes to form an oxynitride film of 70 Å to 100 Å in thickness, and a post annealing process is then performed using $N_2$ gas at a temperature of 900° C. to 950° C. for 5 to 30 minutes.

In the above, the reason why the annealing process is performed under a temperature condition of 900 to 950° C. is that the threshold voltage of the NHVN transistor is lowered if the annealing process is performed at a temperature of over 1000° C. The NHVN transistor is usually used as a transmission transistor in a high voltage pump circuit. This NHVN transistor is not experienced by additional ion implantation process for a high voltage transmission route. Thus, if the annealing process is performed at a temperature of 1000° C. in the process of forming the tunnel insulating film 15, the threshold voltage is too lowered and the circuit thus erroneously operates due to EDR (Electrical Design Rule) spec out. This may cause a serious problem in reliability. For reference, Table 1 below shows the threshold voltage and EDR target of the NHVN transistor depending on a temperature in the annealing process of the tunnel insulating film 15. As shown in Table 1, when the annealing process is performed at a temperature of 1000° C., the low specification of the EDR threshold voltage deviates from −0.27V.

TABLE 1

| | Item | EDR Target | N2O 900° C. | N2O 1000° C. | Remark |
|---|---|---|---|---|---|
| NHVN (W/L, 10/3.0 | 1 | −0.12 ± 0.15 V | −0.186 | −0.316 | 1000° C. spec-out |
| | 2 | 25 ± 85 µA/µm | 31.572 | 31.579 | |
| | 3 | <10 µA/µm | 2.780 | 3.360 | |

The self-aligned shallow trench isolation (SA-STI) process will be hereinafter described with reference to FIG. 3A to FIG. 3E. For explanation's convenience, explanation on the cell region CELL only will be given. It is determined that other regions except for the cell region CELL can be easily implemented by those skilled in the art through description later.

Figure 3A:
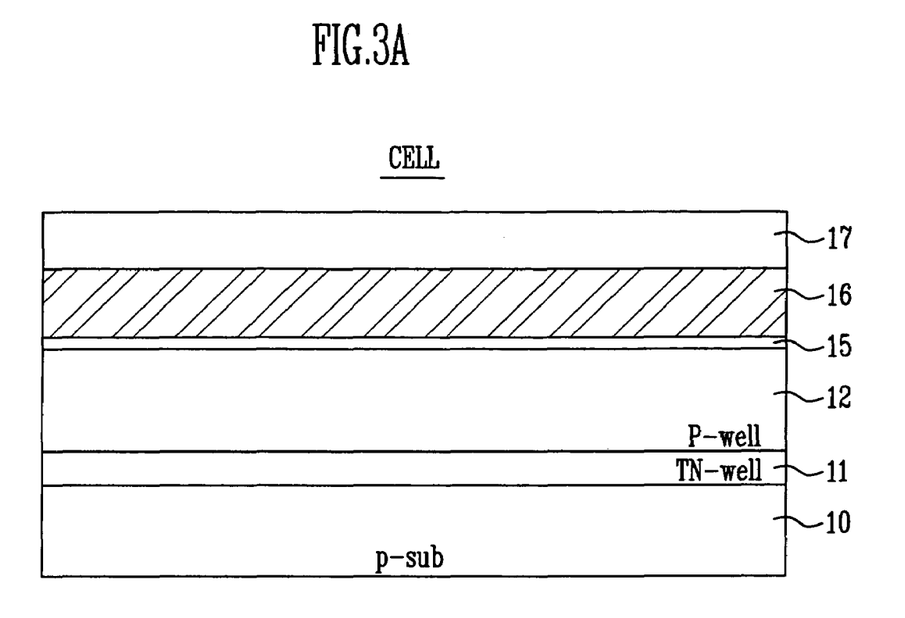

Referring to FIG. 3A, a first polysilicon film 16 is formed on the entire structure. It is preferred that the first polysilicon film 16 is deposited under a temperature condition of 530°

C. to 680° C. and at a low pressure of 0.1 torr to 3 torr so that the grain size is minimized to prevent concentration of an electric field. The sing $N_2O$ gas of 10 slm is then performed under a temperature condition of 900° C. to 950° C. for 10 to 30 minutes to form an oxynitride film of 70 Å to 100 Å in thickness can be deposited in thickness of 200 Å to 800 Å.

A pad nitride film 17 is then formed the first polysilicon film 16. The pad nitride film 17 can be deposited by means of a LP-CVD (Low Pressure Chemical Vapor Deposition) method. It is preferred that the pad nitride film 17 is deposited in thickness of 500 Å or more.

Figure 3B:
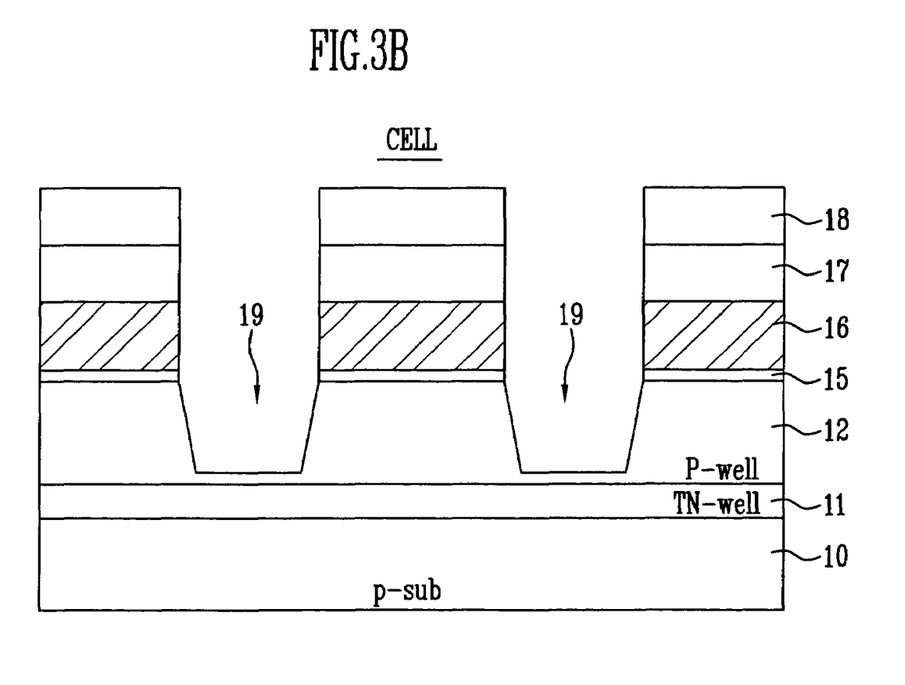

Reference to FIG. 3B, an ISO (ISOlation) mask 18 is formed on the entire structure. In this case, the ISO mask 18 is formed by covering photoresist on the entire structure and then sequentially performing exposure and development processes using the photomask.

Thereafter, the pad nitride film 17, the first polysilicon film 16, the tunnel insulating film 15 and the semiconductor substrate 10 are sequentially etched by means of an etch process using the ISO mask 18, thus forming a trench 19 of a shallow trench isolation (STI) structure. Thereby the semiconductor substrate 10 is defined into a field region and an active region.

Then, in order to compensate for the sidewall of the trench 19 that is damaged when the trench 19 is formed, a dry oxidation process is performed. In this case, the dry oxidization process can be performed in a deposition target of 50 Å to 150 Å under a temperature condition of 700° C. to 1000° C. A wall oxide film (not shown) is thereby formed at the sidewall of the trench 19. Furthermore, the oxidization process for forming the wall oxide film can be performed in order to make rounded the top and/or bottom edge portions of the trench 19 and reduce the critical dimension of the active region as well as compensate for etch damage at the sidewall of the trench 19 when the trench 19 is formed.

Figure 3C:
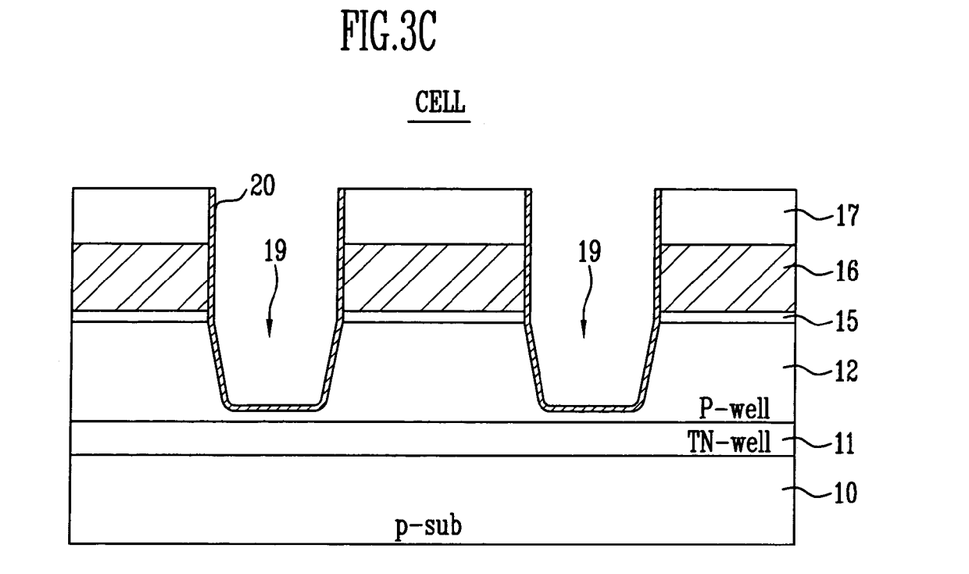

Referring to FIG. 3C, a liner oxide film 20 is formed on the wall oxide film, i.e., on the inner sidewall of the trench 19. In the above, the liner oxide film 20 can be formed by depositing DCS-HTO (Dichlorosilane, $SiH_2Cl_2$—High Temperature Oxide) on the inner wall of the trench 19 (actually, on the wall oxide film) in thickness of 30 Å to 200 Å and then performing an annealing process at a temperature of 800° C. to 850° C. The reason why the liner oxide film 20 is deposited on the inner sidewall of the trench 19 is to prevent the tunnel insulating film 15 from being damaged at the edge portion of the active region by plasma in a subsequent process of forming a high-density plasma (HDP) oxide film 21.

Figure 3D:
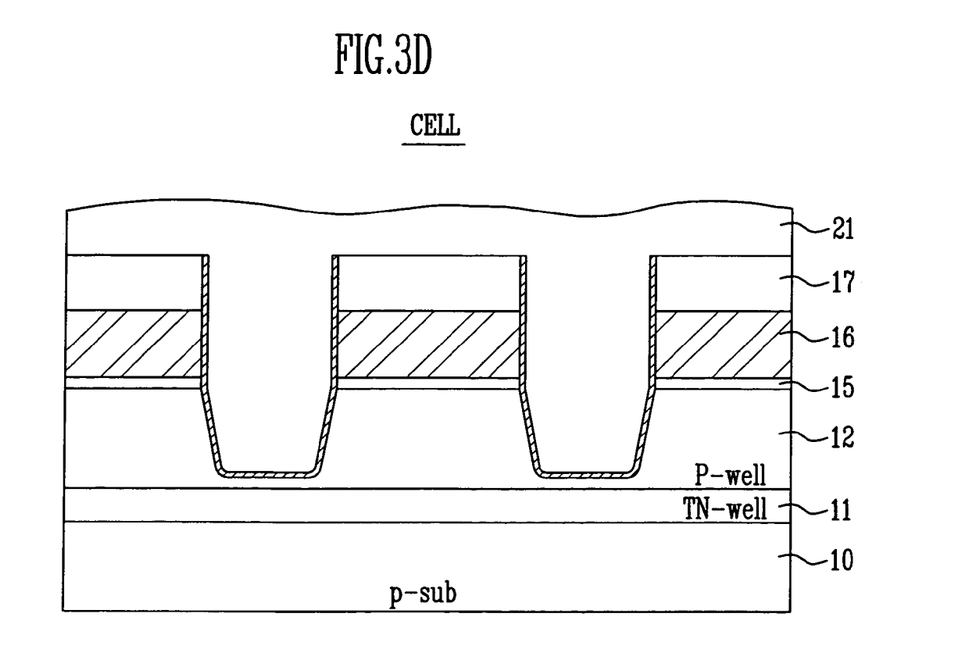

By reference to FIG. 3D, the HDP oxide film 21 is deposited on the entire structure so that the trench 19 is gap-filled. The HDP oxide film 21 is deposited in thickness of about 4000 Å to 10000 Å. The HDP oxide film 21 is then experienced by an annealing process. At this time, the annealing process can be performed using $N_2$ gas of 5 slm to 20 slm for 30 to 120 minutes. Alternately, the annealing process can be performed using $N_2$ gas of 5 slm to 20 slm at a temperature of 800° C. to 950° C. for 30 to 120 miniutes. In this case, the annealing process is a curing process, which is performed in order to improve the properties of the tunnel insulating film 15.

Figure 3E:
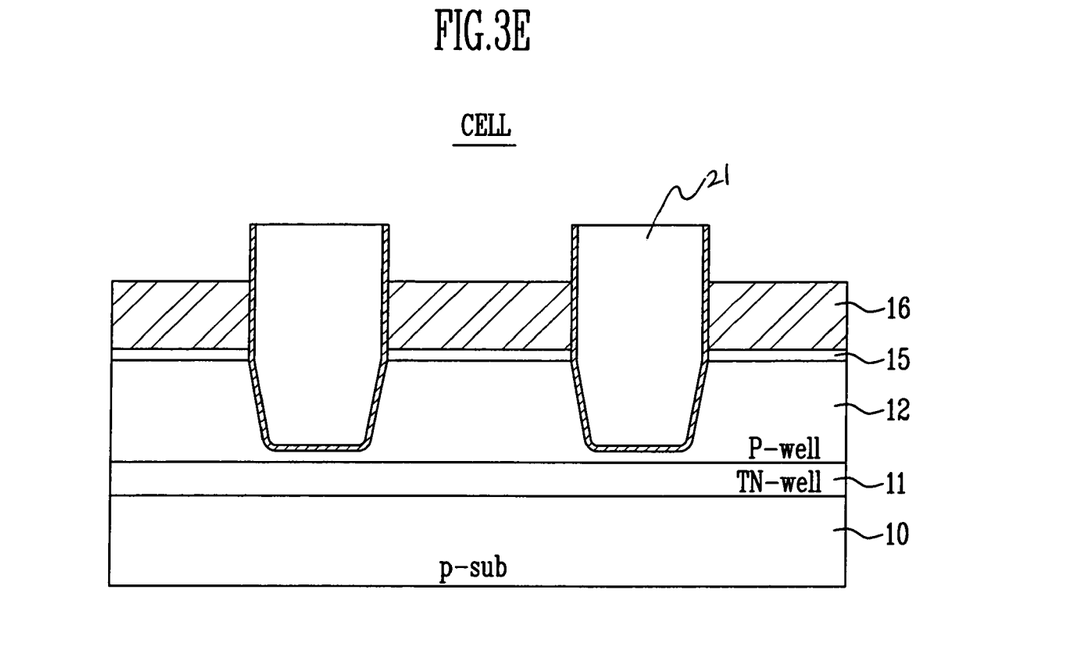

Referring to FIG. 3E, the entire structure is experienced by a polishing process. The polishing process can be performed using a chemical mechanical polishing (CMP) process. A uniform EFH (Effective Fox Height) can be obtained on the wafer through the polishing process. Furthermore, the pad nitride film 17 is removed by phosphoric acid ($H_3PO_4$).

Figure 3F:
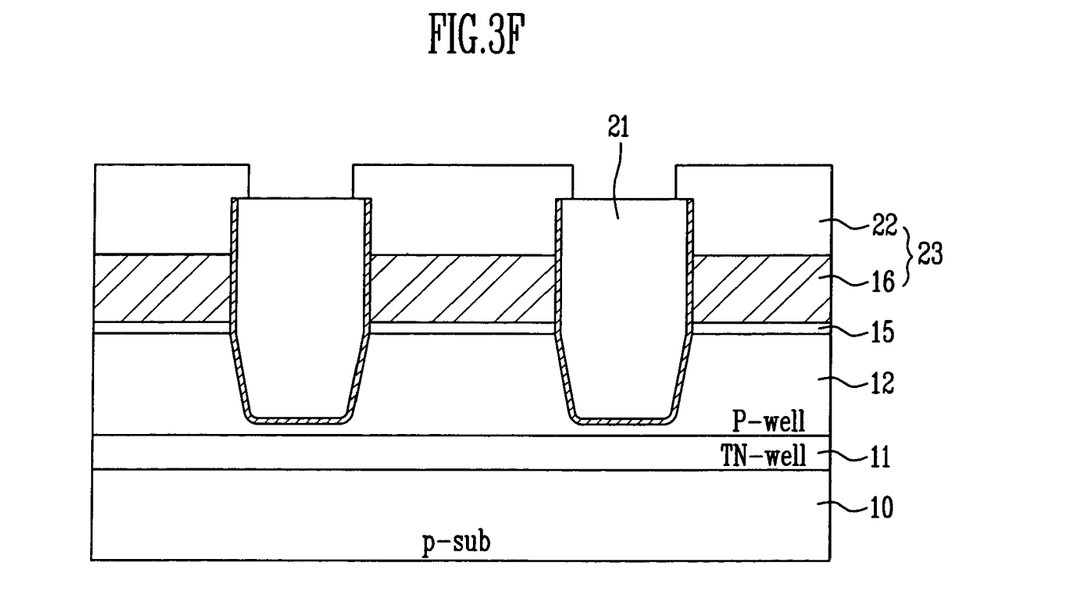

Referring to FIG. 3F, a second polysilicon film 22 is formed on the first polysilicon film 16 exposed by removing the pad nitride film 17. Edges of the second polysilicon film are overlapped with the HDP oxide film 21. The second polysilicon film 22 functions as a floating gate 23 together with the first polysilicon film 16. The second polysilicon film 22 can be formed by depositing a doped polysilicon film under a temperature condition of 400° C. to 600° C. and patterning the doped polysilicon film by means of a lithography process.

Figure 3G:
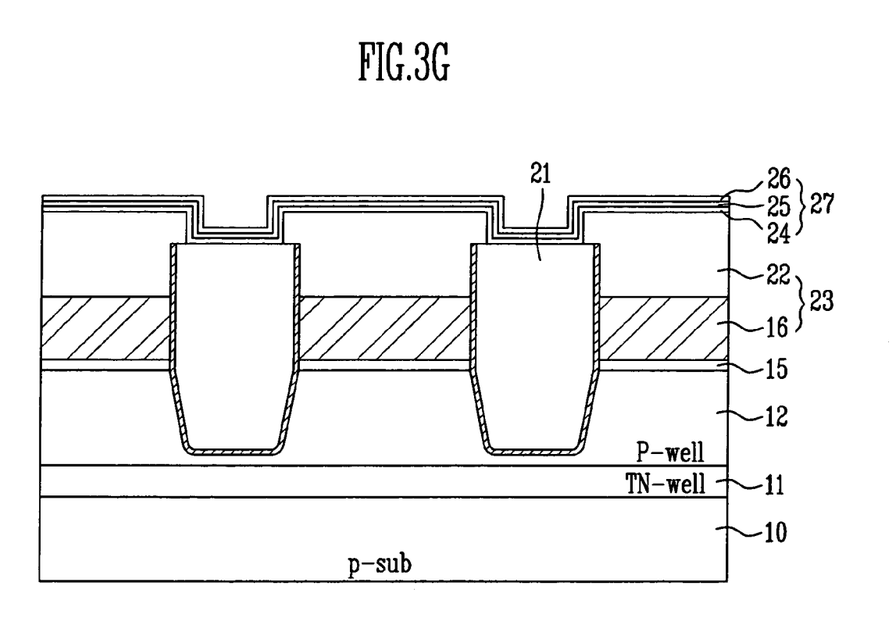

Referring to FIG. 3G, a dielectric film 27 is formed on the entire structure. At this time, the dielectric film 27 can be formed using oxide/nitride/oxide (ONO). For instance, the oxide film 24 being the bottom layer can be formed in thickness of 40 Å to 60 Å using DCS-HTO under a temperature condition of 800° C. to 850° C. Further, the nitride film 25 being the intermediate layer can be formed in thickness of 40 Å to 80 Å using a nitride film under a temperature condition of 600° C. to 700° C. Lastly, the oxide film 26 being the top layer can be formed in thickness of 40 Å to 60 Å using DCS-HTO under a temperature condition of 800° C. to 850° C.

Figure 3H:
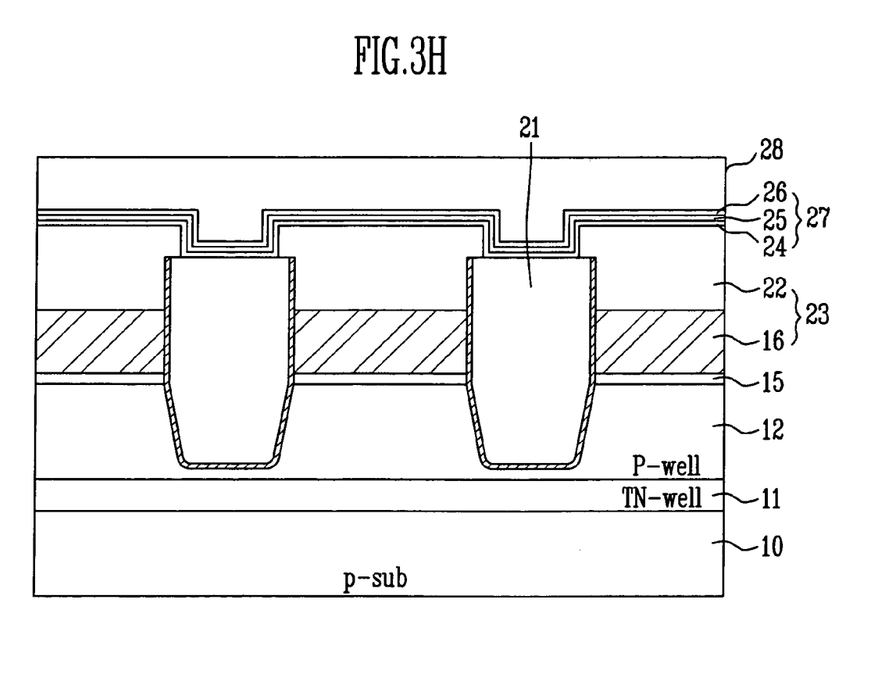

Referring to FIG. 3H, a third polysilicon film 28 is formed on the entire structure. The third polysilicon film 28 functions as a control gate. In this case, the third polysilicon film 28 can be deposited in thickness of 500 Å to 2000 Å using a doped polysilicon film under a temperature condition of 400° C. to 550° C. Also, the doping concentration of the third polysilicon film 28 is $0.5E20/cm^2$ to $5.0E20/cm^2$.

For explanation's convenience, manufacturing processes hereinafter will be simply described without showing drawings.

A tungsten silicide layer Wsix (not shown) and a hard mask layer (not shown) are sequentially formed on the entire structure. An anti-reflective film (not shown) can be also formed on the hard mask layer. The tungsten silicide layer can be deposited in thickness of 500 to 2000 Å under a temperature condition of 400° C. to 500° C. The hard mask layer can be deposited 800 Å to 2000 Å in thickness using PE-TEOS (Plasma Enhanced-Tetra Ethyle Ortho Silicate, $Si(OC_2H_{54})$. The anti-reflective film can be deposited using an oxynitride film in thickness of 300 Å to 1500 Å.

Thereafter, an etch process using a lithography process is performed to define gates (including a control gate and a floating gate). Thereby, the tunnel insulating film 15 formed on the semiconductor substrate 10 is exposed between the patterned gates. In this state, a source/drain ion implantation process is performed to form source and drain regions (not shown) within the semiconductor substrate 10 between the gates. In the above, the source/drain ion implantation process can be formed using phosphorus (P) in a dose of 2.0E12 to 8.0E14 with ion implantation energy of 5 KeV to 30 KeV. At this time, the tilt is set to 0° to 45° and the twist is set to 0° to 270°.

Through the manufacturing method described above according to a preferred embodiment of the present invention respective transistors including the memory cell are formed. In the above, a few sentences have been described in short for explanation's convenience. However, those skilled in the art will easily implement the flash memory device according to a preferred embodiment of the present invention through the manufacturing method described above.

Figure 4:
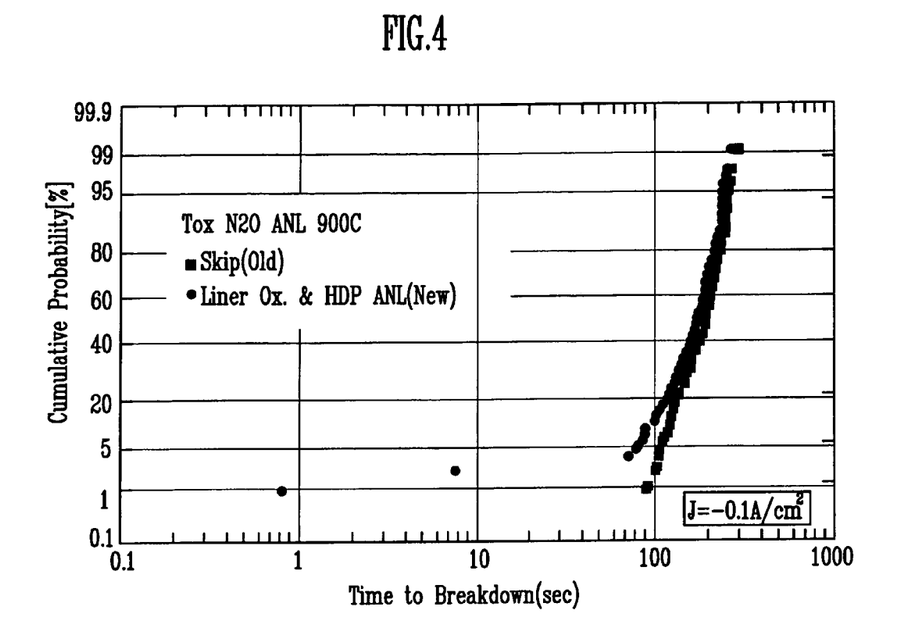
FIG. 4 shows CCST (Constant Current Stress Test) quality of a tunnel insulating film fabricated by a manufacture method according to a preferred embodiment of the present invention.
Figure 5:
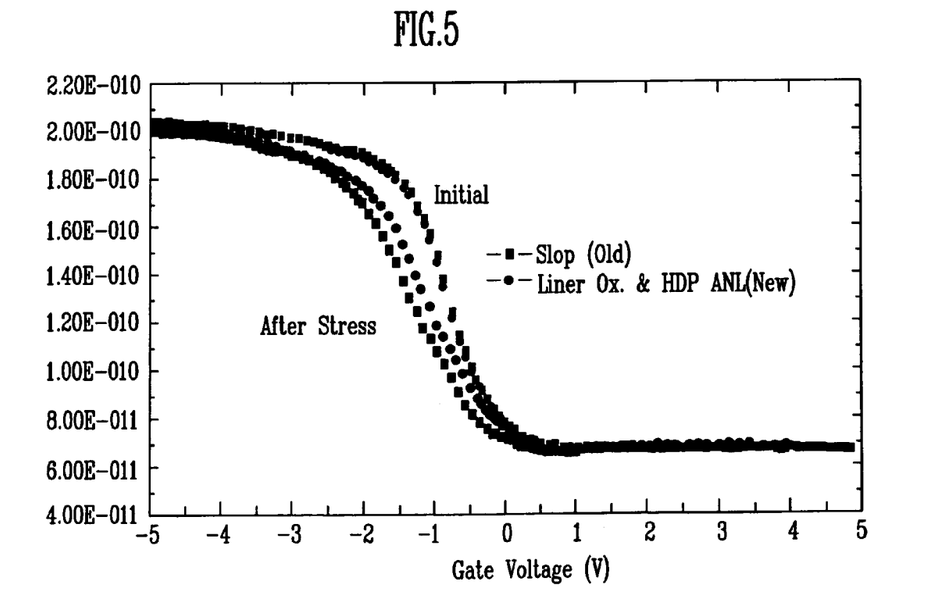
FIG. 5 shows CV (Capacitance Voltage) stress quality of a tunnel insulating film fabricated by a manufacture method according to a preferred embodiment of the present invention.
Figure 6:
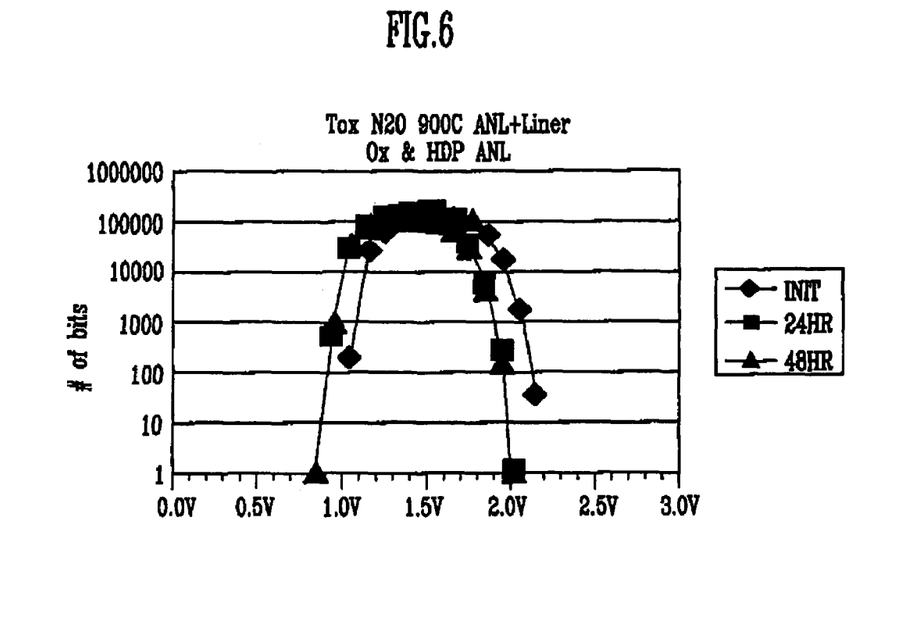
FIG. 6 shows bake retention quality of a tunnel insulating film fabricated by a manufacture method according to a preferred embodiment of the present invention.

Hereinafter, the quality of the tunnel insulating film manufactured through the manufacturing method according to a preferred embodiment of the present invention will be described. FIG. 4 to FIG. 6 show the quality of the tunnel insulating film fabricated by the method for manufacturing the flash memory device according to a preferred embodiment of the present invention.

As described above, FIG. 4 to FIG. 6 show the quality of the tunnel insulating film 15 in case where the tunnel insulating film (15 in FIG. 2) is formed by means of an annealing process using a $N_2O$ gas at a temperature of about 900° C., the liner oxide film (20 in FIG. 3C) is deposited in the SA-STI process as the subsequent process, the HDP oxide film (21 in FIG. 3D) is deposited, and the annealing process is then performed.

FIG. 4 shows the quality of a constant current stress test (CCST). From FIG. 4, it can be seen that the CCST uniformity of the tunnel insulating film 15 is very good. FIG. 5 shows a capacitance voltage (CV) stress quality of the tunnel insulating film 15. From FIG. 5, it can be seen that the CV threshold voltage is reduced after 1.0 C (−0.01 A/cm2× 100 second) stress is applied. Even in the DC stress test, the same result to cycling was obtained. Furthermore, such quality improvements of the tunnel insulating film 15 can be obtained by applying the process of depositing the liner oxide film 20 and the annealing process of the HDP oxide film 21, which are proposed in the manufacturing method according to a preferred embodiment of the present invention. Such quality improvements of the tunnel insulating film 15 can be known through bake. As shown in FIG. 6, if a 512M main chip is baked at a temperature of 250° C. for 48 hours after 10K E/W (Erase/Write) cycling, it can be seen that the programming threshold voltage varies about 0.3V. Moreover, it can be seen that the threshold voltage of the NHVN transistor has almost no change compared to Table 1 and shows a characteristic close to the EDR target, as shown in Table 2.

chip is confirmed only for a current program. It is, however, determined that the distribution will be the same even in the erasure.

Figure 7:
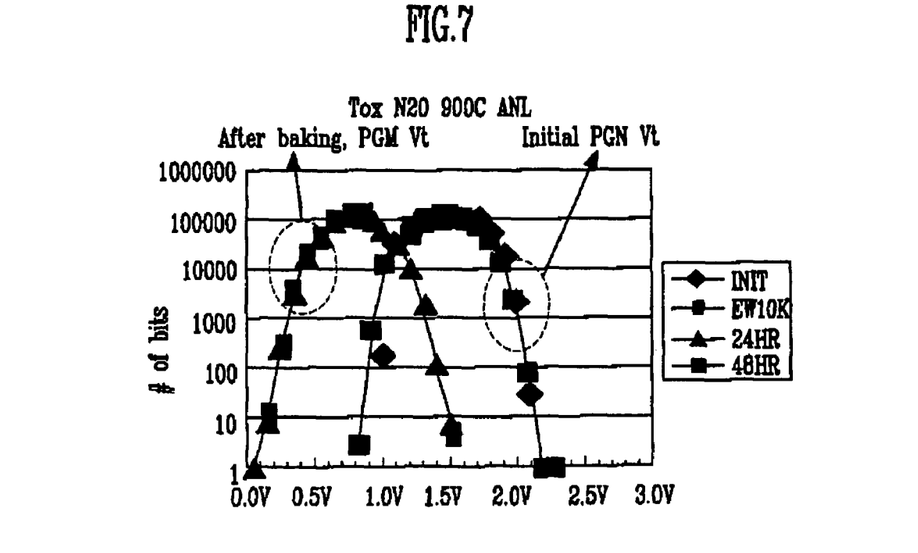
FIG. 7 shows bake retention quality of a tunnel insulating film formed by means of an annealing process using a $N_2O$ gas at a temperature of 900° C.
Figure 8:
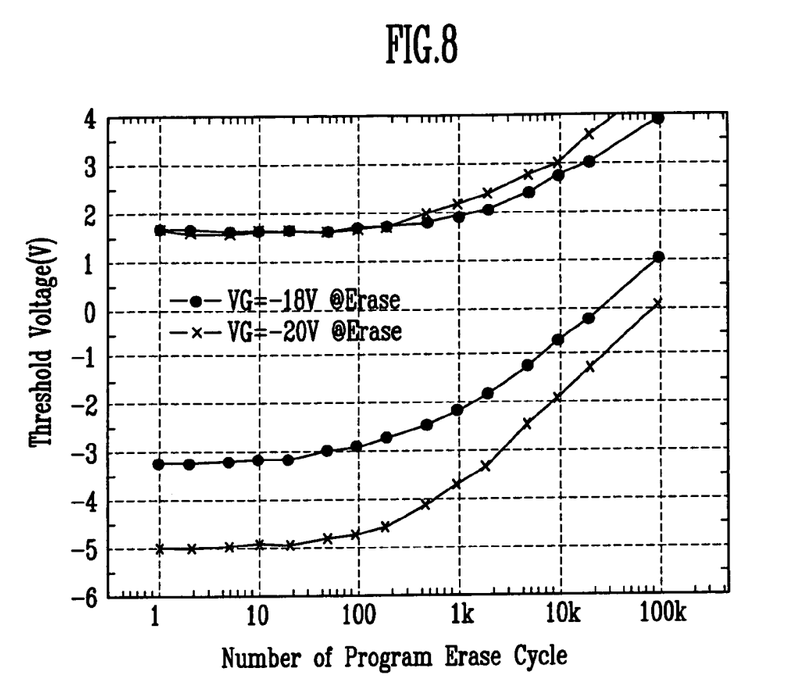
FIG. 8 shows cycling quality depending on a bias of a tunnel insulating film formed by means of an annealing process using a $N_2O$ gas at a temperature of 900° C.
Figure 9:
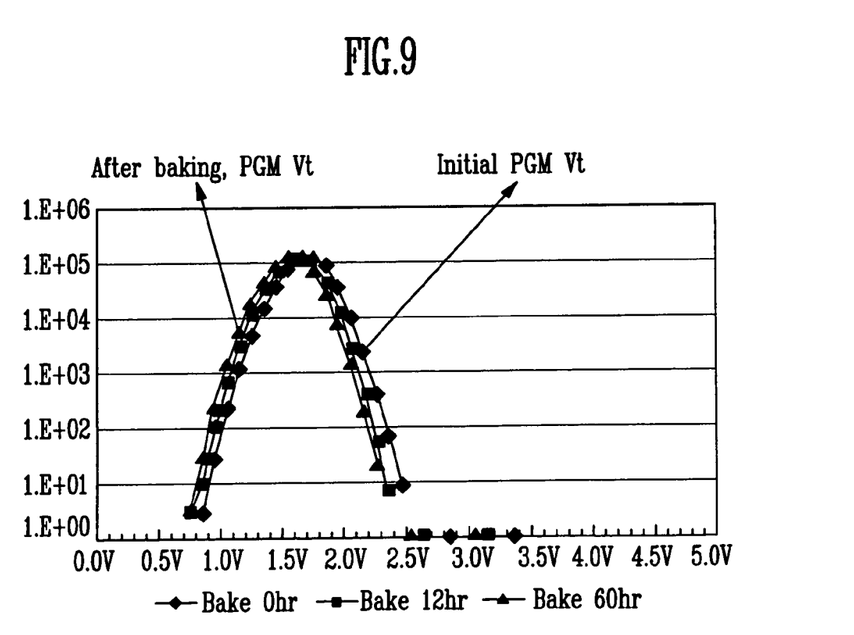
FIG. 9 shows cycling quality depending on a bias of a tunnel insulating film formed by means of an annealing process using a $N_2O$ gas at a temperature of 1000° C.

Meanwhile, FIG. 7 to FIG. 9 are views for explaining variation in the quality of the tunnel insulating film.

FIG. 7 shows variation in an excessive threshold voltage of a tunnel insulating film due to trapped electrons upon application of 10K cycling after the tunnel insulating film is formed by means of an annealing process using a $N_2O$ gas at a temperature of 900° C. As shown in FIG. 7, erasure (−1.5V or less) and programming (1.0 to 3.0V) verify fails occur. The main reason of the data retention quality fail in the bake after the 10K cycling is that as the programming and erasure operations are repeatedly performed formed for F-N tunneling upon 10K E/W cycling, electrons trapped in the tunnel insulating film are re-trapped upon baking performed at a temperature of 250° C., so that the threshold voltage is reduced to about 1.0V.

FIG. 8 shows variation in the threshold voltage of a tunnel insulating film when cycling is applied to the tunnel insulating film with varying bias condition after the tunnel insulating film is formed by means of an annealing process using a $N_2O$ gas at a temperature of 900° C. In order to prevent fails of programmed and erased cells due to variation in an excessive threshold voltage after 10K cycling, the bias condition is increased and the erasure bias is then set sufficiently lower than the verify bias. However, there is a problem that the threshold voltage is increased as much as the bias is increased.

FIG. 9 shows variation in the threshold voltage in the bake after 10K E/W cycling is applied to a tunnel insulating film that is formed by means of an annealing process using a $N_2O$

TABLE 2

| | Item | EDR Target | N2O 900° C. | N2O 1000° C. | N2O 900° C. + Liner ox + HDP ANL | Remark |
|---|---|---|---|---|---|---|
| NHVN 10/3.0 | 1 | −0.12 ± 0.15 V | −0.186 | −0.316 | −0.143 | 1000° C. spec-out |
| | 2 | 25 ± 85 µA/µm | 31.572 | 31.579 | 31.579 | |
| | 3 | <10 µA/µm | 2.780 | 3.360 | 3.360 | |

For reference, the main test items for measuring reliability of the memory cell are E/W cycling and bake operation. E/W cycling is a test operation for testing reliability of the memory cell, wherein the programming operation and the erasure operation are repeatedly performed. Usually, the E/W cycling is performed within 10K to 100K considering the lifespan of the memory cell. The bake operation is for testing reliability of the memory cell like the E/W cycling, wherein reliability of the memory cell under the worst condition, in particular a data retention characteristic is tested. The bake operation specified in the data sheet is performed at a temperature of 250° C. for 48 hours. For example, if the programming threshold voltage is changed over 0.5V compared to the initial state after 10K E/W cycling, the program verify threshold voltage condition is 1.0V to 3.0V and a margin for variation in the threshold voltage of a current programmed memory cell (distribution of the threshold voltage in the programmed memory cell is about 1.5V) is thus about 0.5V, so that fail occurs. Distribution of the threshold voltage of the main cell in the test gas at a temperature of 1000° C. It can be seen that the threshold voltage is below 0.2V in case of the tunnel insulating film.

As shown in FIG. 7 to FIG. 9, it is most preferred that the annealing process of the tunnel insulating film is performed at a temperature of 1000° C. in view of properties of the tunnel insulating film. As described above, however, there occurs a problem that the threshold voltage of the NHVN transistor is too lowered. If the annealing process of the tunnel insulating film is performed at a temperature of 900° C., however, there is almost no change in the threshold voltage of the NHVN transistor. In the present invention, accordingly, the annealing process of the tunnel insulating film is performed at a temperature of approximately 900° C. to optimize the threshold voltage of the NHVN transistor. Further, portions not compensated through the annealing process of the tunnel insulating film are compensated through a subsequent liner oxide film deposition process and a HDP oxide film annealing process.

According to the present invention as described above, an annealing process of a tunnel insulating film is performed at a relatively low temperature to optimize the threshold voltage of a NHVN transistor. Furthermore, in case of portions not compensated through the annealing process of the tunnel insulating film, the quality of the tunnel insulating film is compensated through a subsequent liner oxide film deposition process and a HDP oxide film annealing process, thus improving the quality of the tunnel insulating film. It is thus possible to improve a cell cycling quality and a bake retention quality. Therefore, the present invention has an effect that reliability of the tunnel insulating film is improved to increase the yield.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a flash memory device, comprising the steps of:
    forming a pure oxide layer on a semiconductor by performing a wet oxidization process;
    forming an oxynitride film as a tunnel insulating film by performing a first annealing process to the pure oxide layer;
    forming a first polysilicon film on the tunnel insulating film;
    forming a pad nitride film on the first polysilicon film;
    forming a trench by selectively etching the pad nitride film, the first polysilicon film, the tunnel insulating film and the semiconductor substrate;
    forming a wall oxide film at the sidewall of the trench;
    forming a liner oxide film on the wall oxide film and the sidewall of the pad nitride film;
    performing a second annealing process;
    forming a first oxide film and filling the trench with the first oxide;
    performing a third annealing process to the first oxide film;
    removing the pad nitride film;
    forming a second polysilicon film on the first polysilicon layer exposed by removing the pad nitride film, wherein the first polysilicon film and the second polysilicon film form a floating gate;
    forming a dielectric film on the entire structure having the second polysilicon layer;
    forming a control gate on the dielectric film; and
    forming source/drain regions in the semiconductor substrate exposed between the control gate and a second gate.

2. The method as claimed in claim 1, wherein edges of the second polysilicon layer is overlapped with the first oxide layer.

3. The method as claimed in claim 1, wherein the step of forming the control gate includes:
    forming a third polysilicon film on the dielectric film;
    forming a tungsten silicide layer on the third polysilicon film; and
    patterning the tungsten layer and the third polysilicon film.

4. The method as claimed in claim 1, wherein the first oxide film is formed with high-density plasma (HDP).

5. The method as claimed in claim 1, wherein the first annealing process to the pure oxide is performed by using a $N_2$ gas.

6. The method as claimed in claim 1, wherein the wet oxidization process is performed under a temperature condition of 750° C. to 850° C.

7. The method as claimed in claim 5, wherein the first annealing process is under a temperature condition of 900° C. to 910° C.

8. The method as claimed in claim 7, wherein the first annealing process is performed for 20 to 30 minutes.

9. The method as claimed in claim 1, wherein the first annealing process to the pure oxide is performed by using a $N_2O$ gas.

10. The method as claimed in claim 9, wherein the first annealing process is performed by supplying the $N_2O$ gas of 10 slm for 10 to 30 minutes.

11. The method as claimed in claim 9, wherein the first annealing process is performed under a temperature condition of 900° C. to 950° C.

12. The method as claimed in claim 9, wherein the first annealing process further includes the step of performing a post annealing process using a $N_2$ gas under a temperature condition of 900° C. to 950° C. for 5 to 30 minutes after the first annealing process.

13. The method as claimed in claim 1, wherein the step of forming the wall oxide film is performed by a dry oxidization process under a temperature condition of 700° C. to 1000° C.

14. The method as claimed in claim 1, wherein the second annealing process to the liner oxide film is performed under a temperature condition of 800° C. to 850° C.

15. The method as claimed in claim 1, wherein the liner oxide film is formed in thickness of 30 Å to 200 Å.

16. The method as claimed in claim 1, wherein the third annealing process is performed using a $N_2$ gas under a temperature condition of 800° C. to 950° C.

17. The method as claimed in claim 16 wherein $N_2$ gas is supplied 5 slm to 20 slm.

18. The method as claimed in claim 1, wherein the third annealing process is performed for 30 to 120 minutes.

* * * * *